United States Patent
Schleier-Smith

(10) Patent No.: US 6,786,174 B2
(45) Date of Patent: Sep. 7, 2004

(54) METHOD OF ROBOTIC MANIPULATION USING FLUIDIC PATTERNING

(75) Inventor: Johann M. Schleier-Smith, McLean, VA (US)

(73) Assignee: The Mitre Corporation, McLean, VA (US)

( * ) Notice: Subject to any disclaimer, the term of this patent is extended or adjusted under 35 U.S.C. 154(b) by 0 days.

(21) Appl. No.: 10/743,917

(22) Filed: Dec. 24, 2003

(65) Prior Publication Data

US 2004/0137163 A1 Jul. 15, 2004

Related U.S. Application Data

(62) Division of application No. 10/122,228, filed on Apr. 16, 2002.

(51) Int. Cl.[7] .............................................. C23C 14/00
(52) U.S. Cl. ..................... 118/50.1; 118/621; 118/640; 427/457
(58) Field of Search ............................... 118/50.1, 621, 118/640; 427/457, 483

(56) References Cited

U.S. PATENT DOCUMENTS

| | | | |
|---|---|---|---|
| 3,663,896 A | * | 5/1972 | Parks .......................... 332/149 |
| 4,055,491 A | | 10/1977 | Porath-Furedi |
| 4,523,682 A | | 6/1985 | Barmatz et al. |
| 4,612,018 A | | 9/1986 | Tsuboi et al. |
| 4,693,879 A | | 9/1987 | Yoshimura et al. |
| 4,743,361 A | | 5/1988 | Schram |
| 4,759,775 A | | 7/1988 | Peterson et al. |
| 4,877,516 A | | 10/1989 | Schram |
| 4,879,011 A | | 11/1989 | Schram |
| 4,957,606 A | | 9/1990 | Juvan |

(List continued on next page.)

OTHER PUBLICATIONS

Mary Silber and Anne C. Skeldon. Parametrically excited surface waves: Two–frequency forcing, normal form symmetries, and pattern selection. Phys. Rev. E, 59(5):5446–5456, 1999.

O. Lioubashevski, Y. Hamlet, A. Agnon, Z. Reches, and J. Fineberg, Oscillons and propagating solitary waves in a vertically vibrated colloidal suspension. Phys. Rev. Lett., 3(16):3190–3193, 1999.

S. Kumar. Mechanism for Faraday instability in viscous liquids. Phys. Rev. E, 62(1):1416–1419,2000.

Ron Lifshitz and Dean M. Petrich. Theoretical model for Faraday waves with multiple–frequency forcing. Phys. Rev. Lett., 79(7):1261–1264, 1997.

F. Melo, P.B. Umbanhowar, and H.L. Swinney. Hexagons, Kinks, and Disorder In Oscillated Granular Layers. Phys Rev. Lett., 75(21):3838–3841, 1994.

T. Pritchett and J.K. Kim. A low–cost apparatus for the production of surface wave patterns in a vertically oscillating fluid. AM J. Phys., 66(9):830–833, 1998.

(List continued on next page.)

*Primary Examiner*—Richard Crispino
*Assistant Examiner*—Michelle Acevedo Lazor
(74) *Attorney, Agent, or Firm*—Rosenberg, Klein & Lee

(57) ABSTRACT

A system (100, 100') and method for robotic manipulation of objects (130) is provided wherein a liquid (110, 110') is agitated by the transfer of energy thereto for establishing an oscillatory motion instability in the liquid (110, 110'). The energy input into the liquid (110, 110') forms standing waves (112). The objects (130) align themselves with nodes of the standing waves (112) and thus are dynamically arranged in a configuration established by the location of the standing waves (112). The location of the standing waves (112) can be predetermined by controlling the energy input by energy application system (140) and the size and shape of the container (120). Predetermined waveforms are supplied from the signal source (150, 154) to the energy application system (140).

8 Claims, 6 Drawing Sheets

U.S. PATENT DOCUMENTS

| | | | |
|---|---|---|---|
| RE33,524 E | 1/1991 | Schram | |
| 4,998,553 A | 3/1991 | Schram | |
| 5,006,266 A | 4/1991 | Schram | |
| 5,164,094 A | 11/1992 | Stuckart | |
| 5,484,537 A | 1/1996 | Whitworth | |
| 5,545,367 A | 8/1996 | Bae et al. | |
| 5,711,888 A | 1/1998 | Trampler et al. | |
| 5,831,166 A | 11/1998 | Kozuka et al. | |
| 5,951,456 A | 9/1999 | Scott | |
| 6,029,518 A | 2/2000 | Oeftering | |
| 6,055,859 A | 5/2000 | Kozuka et al. | |
| 6,216,538 B1 | 4/2001 | Yasuda et al. | |
| 6,216,631 B1 * | 4/2001 | Wissner-Gross | 118/50.1 |
| 6,335,059 B1 | 1/2002 | Wissner-Gross | |

OTHER PUBLICATIONS

Uri Raviv, Pierre Laurat, and Jacob Klein. Fluidity of water confined to subnanometre films. Nature, 413:51–54, 2001.

P.B. Umbanhowar, F. Melo, and H.L. Swinney. Localized excitations in a vertically vibrated granular layer. Nature, 382(29):793–796, 1996.

Chen Weizhong and Wei Ronjue. Primary instabilities in Faraday waves under an arbitrarily periodic excitation. Phys. Rev. E, 57(4):4350–4353, 1998.

Xinlong Wang, and Ronjue Wei. Oscillatory patterns composed of parametrically excited surface–wave solitons. Phys. Rev. E, 57(2):2405–2410, 1998.

A. Wernet, C. Wagener, D. Papathanassiou, H.W. Muller, and K. Knorr. Amplitude measurements of Faraday waves. Phys. Rev. E, 63(036305): 1–9, 2001.

T.B. Benjamin and F. Ursell. The stability of the plane free surface of a liquid in vertical periodic motion. Proc. R. Soc. London, Ser A, 225:505–515, 1954.

MC. Cross and P.C. Hohenberg. Pattern formation outside of equillbrium Rev. Mod. Phys., 65(3):851–1089, 1993.

E.A. Cerda and E. Tirapegui. Faraday's instability in viscous fluids. Phys. Rev. Lett., 78(5):859–862, 1997.

E.A. Cerda and E. Tirapegui. Faraday's instability in viscous fluids. J. Fluid Mech, 368:195–228, 1998.

P. Chen and J. Vinals. Amplitude equation and pattern selection in Faraday waves. Phys. Rev. E, 60(1):559–570, 1999.

W.S. Edwards and S. Fauve. Patterns and quasi–patterns in the Faraday experiment. J. Fluid Mech., 278:123–148, 1994.

J. Fineberg and O. Lioubashevski. Propagating solitary waves in highly dissipative driven fluids. Physica A, 249:10–17, 1998.

Alexander Groisman and Victor Steinberg. Solitary vortex pairs in viscoelastic couette flow. Phys Rev. Letter., 78(8):1460–1463, 1997.

S. Kumar. Parametrically driven surface waves in viscoelastic liquids. Physics of Fluids, 11(8):1970–1981, 1999.

S. Fauve, K. Kumar, C. Laroche, D. Beysens, and Y. Garrabos. Parametric instability of a liquid–vapor interface close to the critical point. Phys. Rev. Lett., 68(21):3160–3163, 1992.

* cited by examiner

US 6,786,174 B2

METHOD OF ROBOTIC MANIPULATION USING FLUIDIC PATTERNING

This is a divisional of U.S. patent application Ser. No. 10/122,228 filed Apr. 1, 2002.

BACKGROUND OF THE INVENTION

1. Field of The Invention

This invention directs itself to use of an oscillated fluid medium for robotic manipulation of a plurality of objects. Further, this invention directs itself to the bulk manipulation of objects, and in particular objects on a nanometer scale, through the application of sufficient energy to a relatively thin liquid layer to produce standing waves therein. More in particular, this invention pertains to the application of input waveforms having predetermined energy, frequency and amplitude to produce standing waves at predetermined positions at the interface between a pair of fluids within a container of predetermined size and shape. The objects being manipulated are disposed at the interface between the fluids.

2. Prior Art

The evolution of solid-state electronics from discrete devices to packaged circuits and systems of ever-increasing complexity has been successful, in part, due to the ability to produce the complex combinations of circuit elements en masse. The ability to produce multiple identical circuits simultaneously provides an efficiency that makes the costs of the circuits attractive for industrial and commercial use. The evolution of such circuits utilizing ever smaller components and circuit patterns is pressing mass production methods for such solid-state devices to their limits.

Now that nanoscale electronic components and circuits, formed by single molecules, have been realized, mass production techniques for the assembly of nanoscale circuits and systems are needed. Currently, mechanosynthesis utilizing a scanning tunneling microscope or an atomic force microscope is used to manipulate molecular wires and devices, serially producing one nanoscale circuit at a time. While chemosynthesis promises to produce a multiplicity of molecular circuits simultaneously, a method for segregating each circuit has not yet been demonstrated. One recently developed method which may provide an ability for bulk manipulation of nanoscale elements utilizes patterned granular motion to dynamically position the standing waves at predetermined positions one with respect to the other, and manipulate objects therewith.

In a patterned granular motion robotic manipulation system, a granular bed is oscillated into a "fluidized" state. The objects are mechanically manipulated by collisions between the particulates of the fluidized granular bed and the objects. Where the particulates of the fluidized bed and the objects are nanometer scale, the objects may be manipulated by coulombic fields generated by charged oscillating particles, rather than by mechanical collisions. However, as many molecular electronic devices are formed in a liquid ambient, the most efficient means for then segregating the devices formed therein would be to add the oscillatory energy to that ambient in order to then manipulate the nanoscale devices formed therein.

Thus, by providing unique patterns of standing waves in a liquid, nanoscale objects disposed at the interface between that liquid and a second fluid (a gas or second immiscible liquid) can be manipulated and applied to a substrate. This approach has the significant additional advantage that less energy will be required to produce oscillations. Energy input that would otherwise be required to "fluidize" the medium in an oscillated granular system is avoided where oscillatory energy is applied to a liquid manipulation medium.

SUMMARY OF THE INVENTION

A system for robotic manipulation of a plurality of objects is provided. The system includes a container for receiving the objects therein and a liquid disposed in the container. The objects to be manipulated are disposed on a surface of a liquid layer. The system includes an assembly for applying energy to the liquid to establish oscillatory motion thereof sufficient to form a plurality of repeating vertically directed standing waves. Still further, the system includes a signal assembly coupled to the energy application assembly for supplying the energy with predetermined waveforms to dynamically position the standing waves in a predetermined pattern. The predetermined pattern of standing waves dynamically arranges the objects in a predetermined configuration on the surface of the liquid.

From another viewpoint, a method for robotic manipulation of a plurality of objects is provided. The method includes the steps of providing a container having at least two fluid layers therein. At least one of the fluid layers is formed by a liquid. The method includes the step of then adding the objects to be manipulated to the container. The objects are buoyant in the liquid or otherwise maintained adjacent an interface between the liquid layer and the other fluid layer adjacent to the liquid layer, as by surface tension. Then, the liquid is agitated with energy having a predetermined first waveform to generate a first standing wave pattern therein. The standing wave pattern of liquid dynamically arranges the objects. Then, a substrate is positioned in the container, the substrate being adapted for adhesion of the objects thereto.

DESCRIPTION OF THE PREFERRED EMBODIMENTS

Referring to FIGS. 1–6, there is shown, robotic manipulation system 100, 100' for dynamically manipulating objects utilizing dynamic instabilities induced at the surface or in the bulk of the fluid medium, the fluid medium having been excited into an oscillatory motion. The instability in the fluid medium may be induced by such means as mechanical oscillation of the fluid, use of electric or magnetic fields of a polarized fluid, the establishment of convection currents within the fluid, or the application of shear forces to the fluid. As will be seen in following paragraphs, robotic manipulation system 100, 100' is specifically directed to the concept of bulk manipulation of objects to fabricate a multiplicity of structures in parallel. Robotic manipulation system 100, 100' is particularly directed to application of nanometer scale assemblies or systems, such as the dynamic arrangement of molecular-scale structures or nanoparticles or nanorods to provide a circuit pattern, positioning of a molecular electronic device, or the formation of a mechanical structure. Molecular-scale structures include single molecules, such as those that form nanoscale electronic devices.

Figure 1:
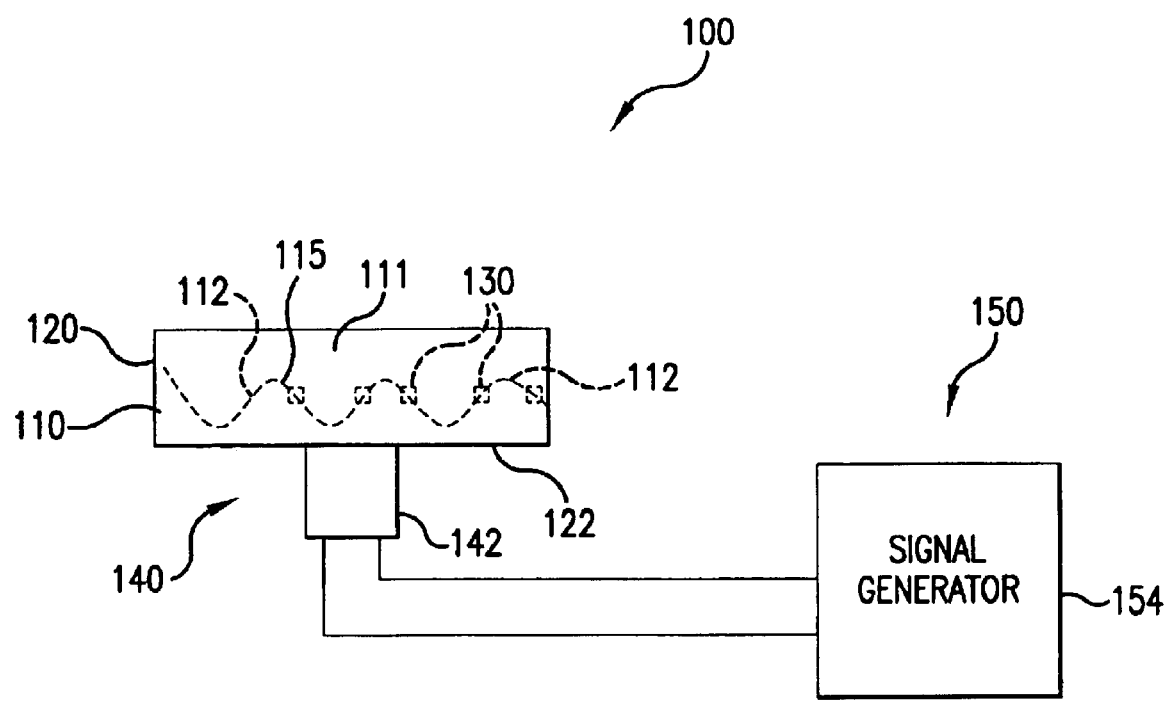
FIG. 1 is a schematic block diagram illustrating one embodiment of the present invention.
Figure 2B:
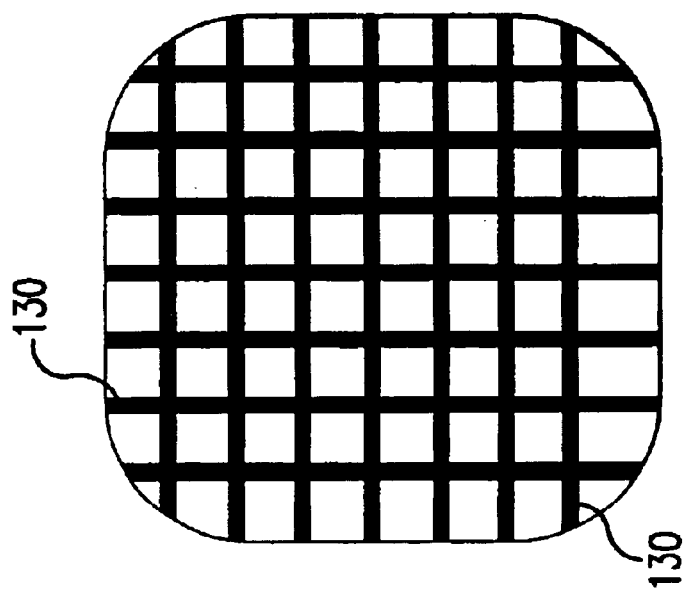
FIG. 2B is a top view of the oscillated liquid in the embodiment of FIG. 1 wherein a square pattern is formed.
Figure 2A:
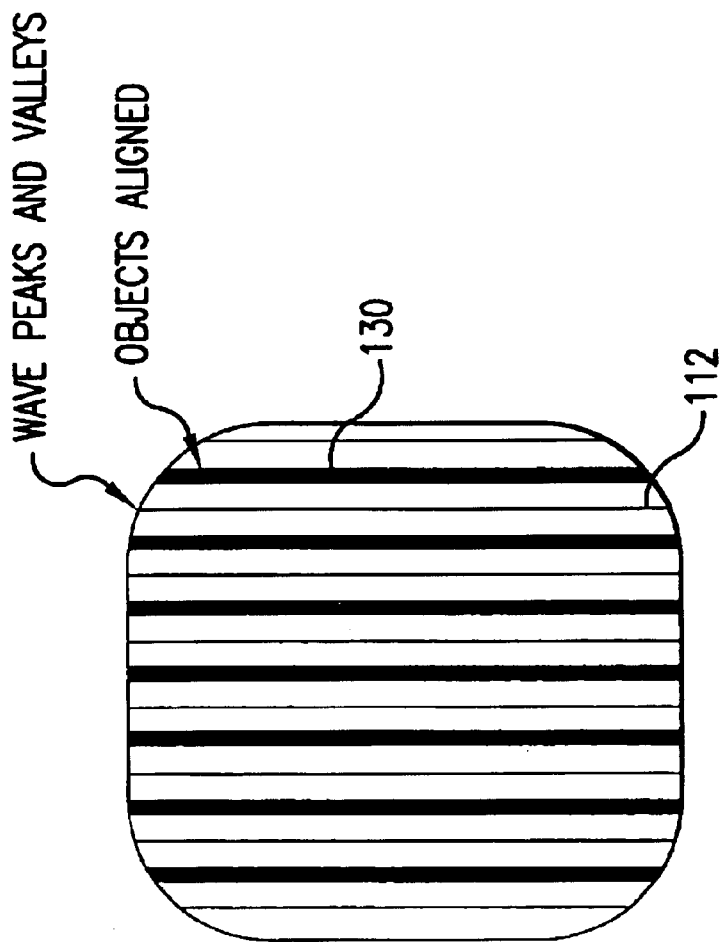
FIG. 2A is a top view of the oscillated liquid in the embodiment of FIG. 1 wherein a striped pattern is formed.

Referring to FIGS. 1, 2A and 2B, the energy applied to the relatively thin liquid layer 110 within container 120 establishes standing waves 112 having vertical displacement which simultaneously mechanically manipulate the plurality of objects 130, by surface forces therebetween. The surface forces between the liquid in each of the standing waves and the respective objects 130 position the objects dynamically in correspondence with a standing waves, the objects being positioned at nodes of the waves, positions where the displacement of liquid layer 110 over time is substantially zero. Thus, where the standing waves establish particular patterns, such as stripes (FIG. 2A), squares (FIG. 2B), hexagons, etc, the objects 130 can be arranged, dynamically, in correspondence with those patterns. The patterns can be established, as desired, by controlling the waveform and frequency of the energy applied to the liquid layer 110. However, a saturation phenomena of the instability limits the shortest wavelength that can be produced as a function of the liquid's density, viscosity, surface tension, and layer depth. The objects being manipulated can be integrated circuit chips, discrete circuit components, conductive elements, or mechanical components, for example. The dynamic arrangement of the objects can represent a plurality of substantially identical circuits or patterns formed simultaneously. Similarly, the objects manipulated can be mechanical components that are assembled into a plurality of substantially identical mechanical assemblies or systems. As will be described with respect to the embodiment of FIG. 6, a substrate 134 is positioned in the container 120 and adapted for adherence of the objects 130 thereto.

System 100 is shown wherein a pair of fluid layers 110 and 111 are disposed within the container 120. The lower layer 110 is formed by a liquid and the upper layer is formed by air, in this example. In place of air, a less dense liquid can form the upper fluid layer. Use of an upper immiscible liquid layer may be beneficial where the objects 130 that are to be manipulated require avoidance of exposure to a gaseous atmosphere or where the upper liquid layer promotes the transference of the manipulated objects 130 to a substrate 134 (shown in FIG. 6). The energy application system 140 applies energy to the container 120 to vibrate at least one wall thereof, such as the bottom wall 122. The vibration of wall 122 establishes an oscillatory motion in the liquid 110 to form a plurality of repeating vertically directed standing waves 112. Multiple walls can be vibrated in order to achieve a particular pattern of standing waves 112. Within container 120 there is also provided a plurality of objects 130 that are to be manipulated, the objects 130 being buoyant in the lower liquid layer 110 or otherwise maintained at the surface of the lower liquid layer 110 by surface tension or other chemical surface interactions. Dynamic forces between the standing waves 112 and the objects 130 dynamically arrange the objects in correspondence with the standing waves, the objects 130 being disposed at the interface 115 between the lower fluid layer 110 and the upper fluid layer 111. Where the standing waves are formed as "stripes", rows of objects can be realized, as shown in FIG. 2A. By varying the energies, frequencies, and amplitudes of the inputs as well as the size and shape of the container, complex waveforms can be generated with standing waves located at predetermined positions.

The production of short wavelengths, wavelengths less than 1 mm, liquid layer 10 must be a shallow layer. As a rule of thumb, the liquid depth should be of the same order as the excitation wavelength. The critical acceleration above which a pattern is excited in the shallow layer is, for practical purposes, equal to the square of the kinematic viscosity of the liquid divided by the cube of the layer height. For example, in water having a kinematic viscosity approximating $10^{-6}$ m$^2$/s at room temperature, a wavelength of one micron requires approximately $10^6$ m/s$^2$ of acceleration. Such acceleration may be obtained with a one micron displacement of an actuator driven at 160 kHz.

Figure 4:
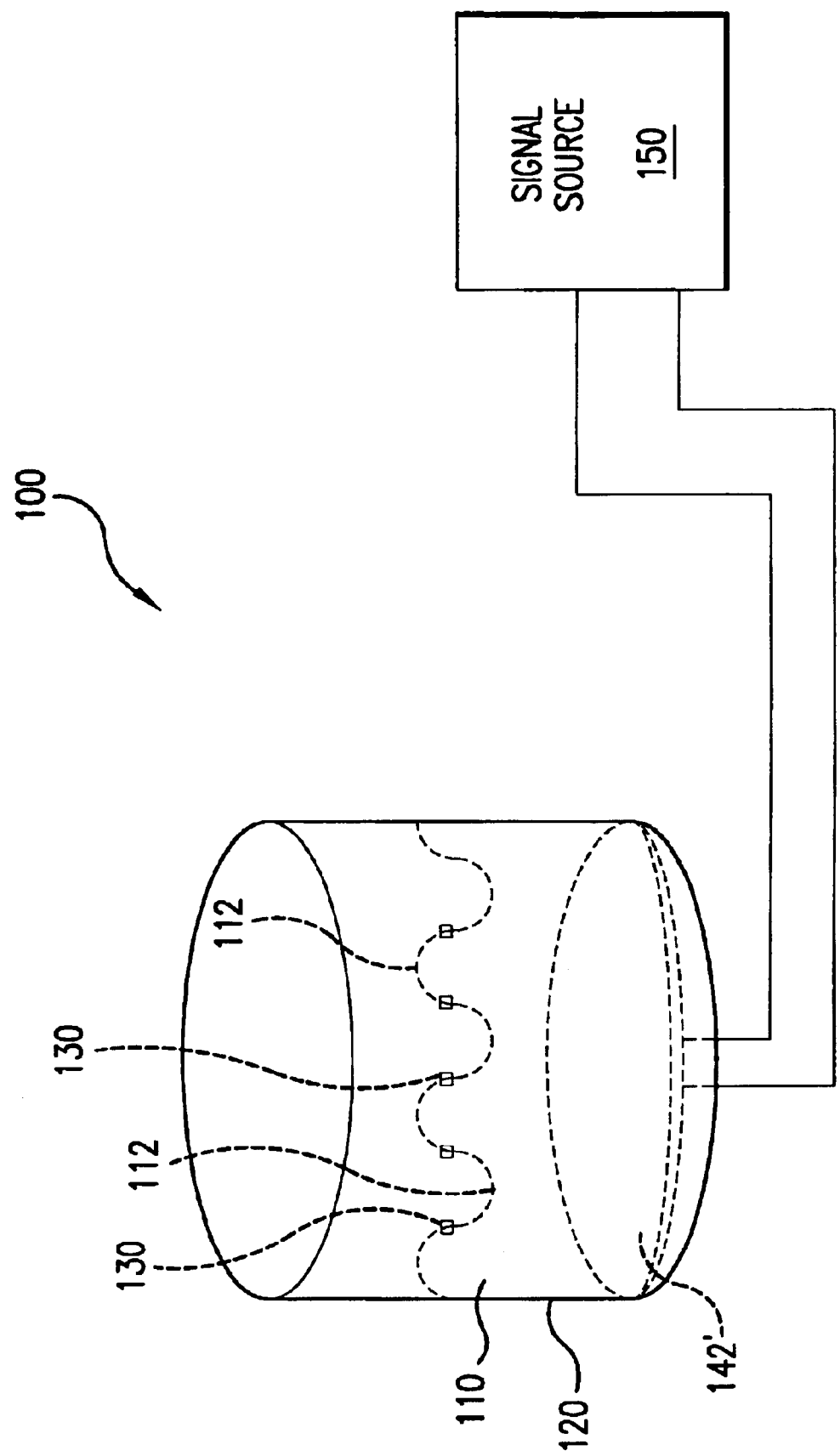
FIG. 4 is a schematic block diagram illustrating another alternative configuration for the energy application system used in the invention of the subject patent application.

The energy application system 140 may include one or more vibratory actuators 142 that are driven by a signal source 150. A vibratory actuator 142 may be an electromechanical or piezoelectric device that is mechanically coupled to the liquid layer 110. The vibratory actuator 142 may be mechanically coupled to the liquid layer 110 by, for example, being coupled to one of the container walls. Alternately, piezoelectric devices may be incorporated into the structure of the bottom wall in the form of an integral structure. Still further, the vibratory actuator 142' may be located in container 120 to contact liquid layer 110 directly, as shown in FIG. 4. The signal source 150 includes at least one signal generator 154 having the capability to output electrical signals having predetermined waveforms for driving a vibratory actuator 142, 142'. The signals output from signal source 150 may be non-sinusoidal oscillatory signals to form complexly structured standing waves of the liquid layer 110, the standing waves having a complex periodicity or multiple complex periodicities.

Figure 3:
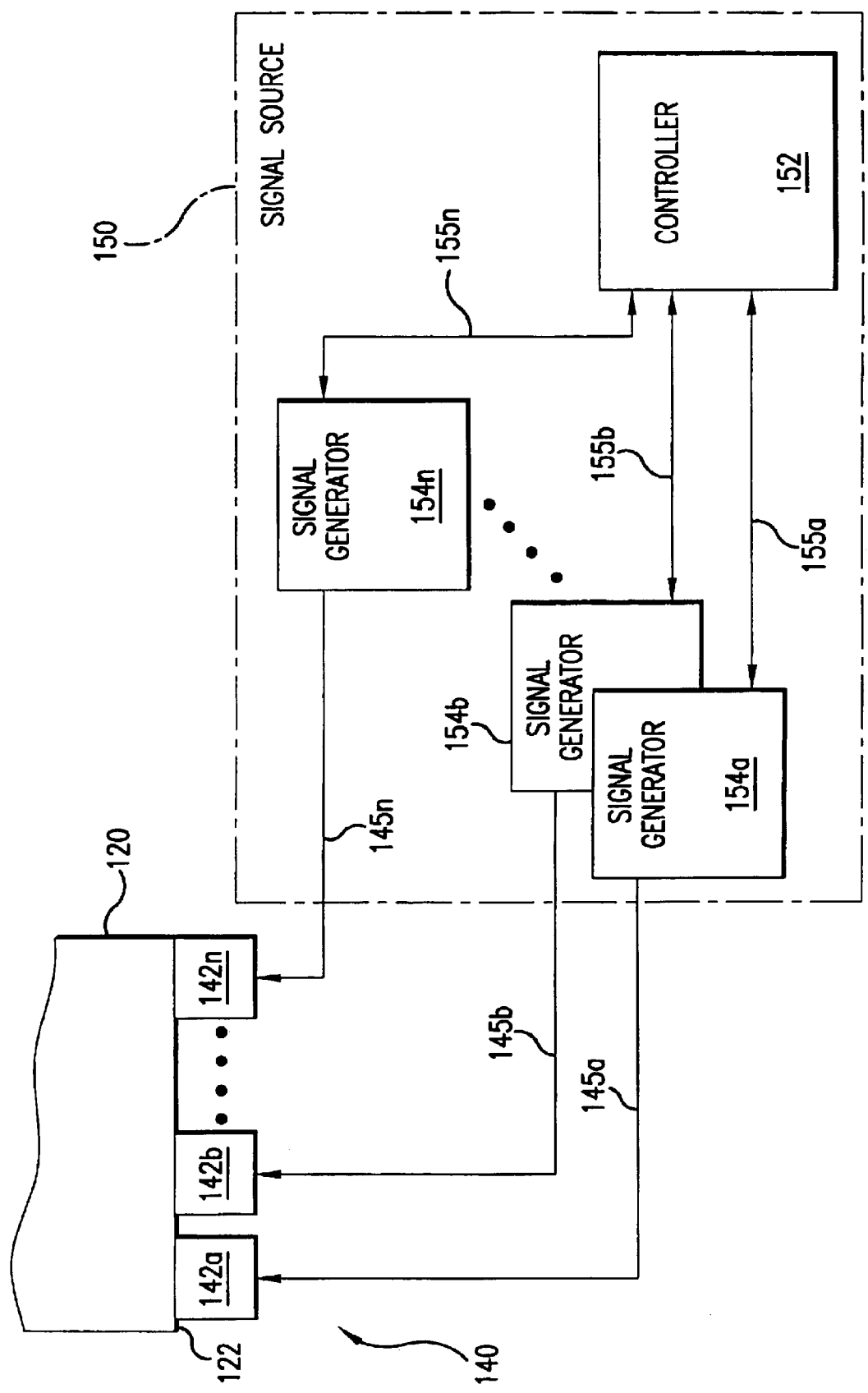
FIG. 3 is a schematic block diagram illustrating an alternative configuration for the energy application system used in the invention of the subject patent application.

As shown in FIG. 3, the energy application system 140 may be formed by a plurality of vibratory actuators 142a–142n, each respectively driven by the signal source 150. Signal source 150 may be formed by a single signal generator having multiple outputs or, as shown, is formed by a plurality of signal generators 154a–154n, each having an output 145a–145n respectively coupled to the vibratory actuators 142a–142n. In order to coordinate the resultant vibratory patterns formed by the fluid within container 120 to which the vibratory energy has been transferred, the signal generators 154a–154n are coupled to a controller 152 which provides command signals to each of the signal generators 154a–154n and may receive status therefrom. Controller 152 may be a microprocessor or personal computer programmed to control the signal generators. The plurality of vibratory actuators 142a–142n may be discrete devices or integrally formed in one or more walls of the container. The manipulation of objects 130 may be carried out in discrete steps, with the waveforms of signals from power source 150 being changed over time in accordance with a predetermined program run in controller 152. In this way, more complex arrangements of objects can be established.

Figure 5:
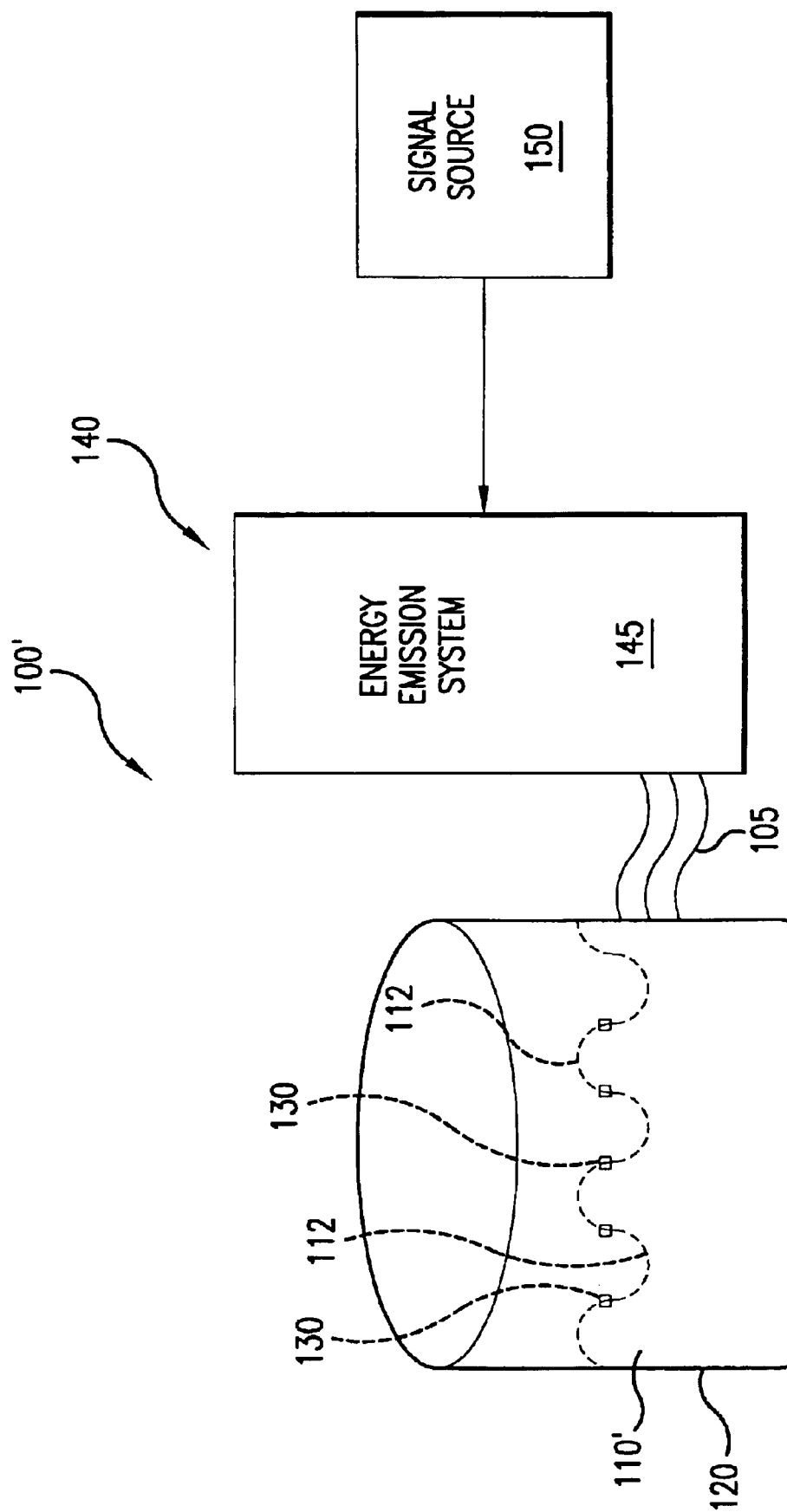
FIG. 5 is a schematic block diagram of an alternate embodiment of the invention of the subject patent application; and, FIG. 6 is a schematic block diagram of the embodiment of FIG. 1 with a substrate incorporated therewith.

The manipulation of nanometer-scale objects requires the ability to produce standing waves with nanometer-scale spacing. A practical method of generating such standing waves is by applying a spatially uniform electric field, represented by the lines 105, to a portion 108 of container 120 in order to apply energy to a nematic liquid crystal medium 110', as illustrated in FIG. 5. Utilizing the nematic liquid crystal medium 110', the oscillating electric field emulates a vertically vibrating surface, as is produced when the liquid 110 is mechanically vibrated in the examples of FIGS. 1–4.

An example of a nematic liquid crystal medium suitable for use as layer 110' is a commercially available liquid crystal product having the designation BDH-17886 from Merck Ltd. or the liquid crystal composition p-meth-oxy-n-p-benzilidene butylaniline (MBBA). The depth of the nematic liquid crystal medium 110' and the necessary electric field strength scales like that of the mechanically generated instabilities. The nematic liquid crystal layer depth should be of the same order as the excitation wavelength. The applied electric field scales as the square of the viscosity divided by the cube of the layer thickness. The liquid layer may also be formed by a ferrofluid that is oscillated by oscillatory magnetic fields in the container provided by energy emission system 145. A suitable ferrofluid is a colloidal suspension of magnetite, $Fe_3O_4$, nanoparticles, particles having a diameter approximating 10 nm or less. One such ferrofluid is commercially available from Ferrotec America Corporation of Nashua, NH and has the designation EFH1.

In order to force the liquid crystal medium 110' vertically, the liquid crystal medium 110' is polarized and the energy application system 140 of system 100' includes an energy emission system 145 having a plurality of electrodes disposed in proximity of container 120 for establishing one or more oscillating electric fields therein. Although the electric fields are oscillatory, they need not necessarily be periodic. The nematic liquid crystal medium 110' is disposed between at least two electrode plates to which electrical signals having predetermined waveforms are applied from the signal source 150. That arrangement emulates a vertically vibrating surface to establish convection cells 112 in the medium 110'. The convection cells 112 of medium 110' will dynamically arrange nanometer-scale objects 130, each of whose size, diameter or smallest outside contour dimension, is less than 10 microns. An example of an electrode arrangement useful in establishing the required electric fields my be found in U.S. Pat. No. 6,216,631.

Nanometer-scale objects likely to be manipulated by the method and system disclosed herein include nanoparticles, nanorods, molecular diodes, molecular transistors, molecular logic devices or other circuits formed by a single molecule, molecular structures which function as "wires", other molecular-scale structures, molecules having medical/pharmacological significance, etc. Components of quantum computers, other novel types of nanocomputers, and nanomachines also are likely to be manipulated and assembled by this method. There is also great interest in structures that can serve as interconnecting conductive elements for combining the molecular and other nanometer-scale circuits into more complex functions. One promising conductive element is the carbon nanotube. By adjustment of the location of standing waves of particulates 110', objects such as nanotubes can be arranged in a predetermined electrical circuit pattern. In order to make use of that circuit pattern, the nanotubes 130 need to be applied to a substrate, as do molecular circuit elements to be combined into more complex circuits.

Figure 6:
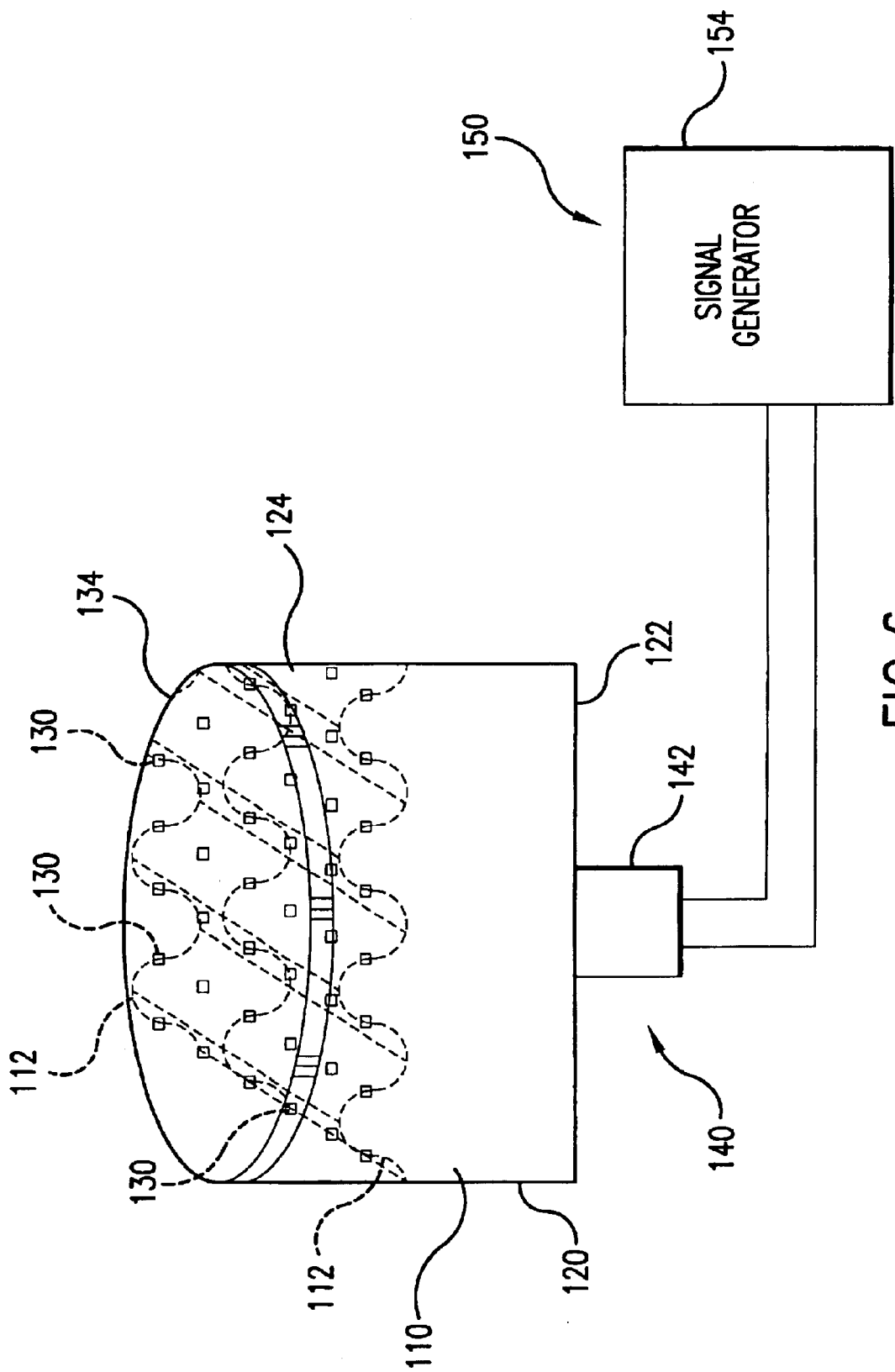

Referring to FIG. 6, one method for applying the objects 130 to a substrate is shown. In this example, the substrate 134 is disposed above the objects 130, and the lower surface of the substrate 134 is adapted for adherence of the objects thereto. Such adaptation may be in the form of selecting a substrate material which has an affinity for the composition of the objects 130, the application of a coating that provides a bond between the objects 130 and the substrate 134, or the application of a particular charge to the substrate 134 to attract the objects 130. The substrate 134 may be positioned in or on container 120 prior to the establishment of the oscillated fluid motion or subsequent thereto. Once the objects 130 have been positioned on the bottom substrate surface, the substrate may be separated from the container 120 and passed on for further processing, which may include the separation of the substrate into a plurality of individual segments, not unlike the separation of a silicon wafer into a plurality of integrated circuit chips, as is the practice in the present microelectronics industry. Thus, a plurality of substantially identical and separable nanoscale circuits or circuit patterns can be formed simultaneously.

The objects 130 are disposed at the interface between the liquid 110 and a second fluid 124, the fluid 124 extending to the bottom surface of the substrate 134. The fluid 124 may be a medium, such as a vacuum, a gas, an immiscible liquid, or an immiscible gel, that is less dense than liquid 110. Such a medium would be provided to facilitate processing, take advantage of a particular characteristic of the objects being manipulated, or facilitate the use of a particular liquid medium to which the oscillatory energy is transferred.

As previously discussed, there are predetermined topological configurations of standing wave patterns that can be selectively formed by the input of oscillating signals having predetermined waveforms to the energy application system 140. The vibrations produced by the transducer 142 or the electric fields established by the energy emission system 145, add energy to the liquid medium 110, 110' disposed in container 120, the energy being sufficient to establish vertically directed oscillatory motion in the liquid medium. The oscillatory motion of medium 110, 110' consists of respective standing waves, with the standing waves being used to mechanically and dynamically arrange objects 130. Accordingly, nanometer-scale objects such as conductors defined by carbon nanotubes or polyphenylene molecular wires, metal or semiconductor nanorods, molecules defining molecular electronic devices, quantum computer components, or nanomechanical components, can thereby be manipulated en masse. Complex manipulation of the objects can be accomplished by a stepwise movement thereof, moving the objects from one intermediate location to the next by replacing one standing wave pattern with another, until the desired final position is reached.

The method for robotic manipulation of a plurality of objects includes the steps of providing a container, the container being capable of generating rapid oscillation of a portion thereof, at a high frequency, and providing at least one liquid in the container. The objects to be manipulated are added to the container and the liquid is agitated with energy having predetermined waveforms to generate standing wave patterns therein. The standing wave patterns dynamically arrange the objects. Examples of such arrangements are predetermined circuit configurations of objects defined by electronic devices or electrical circuit patterns of objects defined by electrically conductive structures. The arrangement of objects may also form other types of assemblies, as well. The method also includes the positioning of a substrate in the container, wherein the substrate is adapted for adhesion of the objects thereto. The positioning of the substrate can precede the agitation of the particulates, or be subsequent thereto. The agitation of the plurality of particulates may be achieved by vibrating a wall of the container or by a transducer disposed in the container. Another method of achieving the desired standing waves is through the use of a nematic liquid crystal composition, where the composition is charged with a predetermined polarity, and an oscillating electric field is established within the container. The objects to be manipulated may have a size less than 10 microns, i.e., a diameter less than 10 microns, or the smallest dimension of the object's outer contour being less than 10 microns. The objects may be single molecules or they may be other molecular-scale structures. The liquid media are selected so that the objects to be manipulated are maintainable at the surface thereof, as they are manipulated by surface effects. In order to achieve high frequency oscillation using a reasonable energy input, the viscosities of the liquid media must be as low as possible. It is useful to approach the liquid-gas phase transition, as by heating, to achieve low viscosity. Using this method, a plurality of substantially identical nanoscale structures can be formed on a substrate. Thus, the fabrication of the plurality of circuits, circuit patterns, systems, machines, or assemblies takes place in parallel, constituting a bulk fabrication process.

Within a single liquid layer, rather than at an interface between two fluid layers, convective roll instability can be induced to position objects. Convective roll currents can be generated by applying electric fields across nematic liquid crystals, the introduction of a thermal gradient to the liquid layer, as either a Rayleigh-Benard or Benard-Marangoni convection, or exposing the liquid layer to shear forces to produce Taylor-Couette convection.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is being claimed is:

1. A method for robotic manipulation of a plurality of objects comprising the steps of:

a. providing a container;

b. providing at least two fluid layers in said container, at least one of said fluid layers being formed by a liquid;

c. adding said objects to be manipulated to said container, said objects being disposed adjacent an interface between said liquid layer and said other fluid layer adjacent to said liquid layer;

d. agitating said liquid with energy having a predetermined first waveform to generate a first standing wave pattern therewith at said interface, said standing wave pattern of liquid dynamically arranging said objects; and, e. positioning a substrate in said container, said substrate being adapted for adhesion of said objects thereto.

2. The method as recited in claim 1 where the step of agitating said liquid includes the step of vibrating a wall of said container.

3. The method as recited in claim 1 where the step of includes the step of agitating said liquid includes the step of energizing a piezoelectric actuator mechanically coupled to said liquid.

4. The method as recited in claim 1 where the step of providing at least two fluid layers includes the step of providing at least one nematic liquid crystal layer and said step of agitating said liquid crystal layer includes the step of establishing and applying oscillatory electric fields thereto.

5. The method as recited in claim 4 where the step of establishing and applying oscillatory electric fields includes the step of generating predetermined waveforms for establishing said oscillatory electric fields and thereby dynamically arranging said objects in a predetermined pattern.

6. The method as recited in claim 1 where the step of adding said objects includes the step of providing molecular-scale circuit elements as objects to be manipulated and the step of agitating includes the step of generating said predetermined first waveform to dynamically arrange said molecular circuit elements into a plurality of substantially identical nanoscale circuits.

7. The method as recited in claim 1 where the step of adding said objects includes the step of providing nanometer-scale mechanical elements as objects to be manipulated and the step of agitating includes the step of generating said predetermined waveforms to dynamically arrange said mechanical elements into a plurality of substantially identical nanoscale machine assemblies.

8. The method as recited in claim 1 where the step of positioning a substrate is followed by repeating the step of agitating said liquid, the liquid being agitated by energy having a predetermined second waveform to generate a second standing wave pattern therewith to thereby displace said objects on said substrate.

* * * * *